United States Patent [19]

Siroky

[11] Patent Number: 5,519,584
[45] Date of Patent: May 21, 1996

[54] LAMINATED CYLINDRICAL BACKPLANE

[75] Inventor: John Allen Siroky, Gahanna, Ohio

[73] Assignee: AT&T Corp., Murray Hill, N.J.

[21] Appl. No.: 362,064

[22] Filed: Dec. 22, 1994

[51] Int. Cl.⁶ .................................................. H05K 1/14
[52] U.S. Cl. ...................... 361/789; 361/788; 361/790;
    361/784; 439/59; 439/61; 439/62; 174/261
[58] Field of Search ................................... 174/250, 261;
    439/59, 60, 61, 62, 188; 361/785, 788,
    787, 789, 784, 790

[56] References Cited

U.S. PATENT DOCUMENTS

| | | | |
|---|---|---|---|
| 4,679,872 | 7/1987 | Coe | 439/61 |
| 5,119,273 | 6/1992 | Corda | 361/413 |
| 5,301,089 | 4/1994 | Takashima | 361/744 |
| 5,319,526 | 6/1994 | Takashima | 361/788 |
| 5,341,509 | 8/1994 | Takashima | 395/800 |

Primary Examiner—Laura Thomas
Attorney, Agent, or Firm—Christopher N. Malvone

[57] ABSTRACT

A laminated cylindrical backplane is constructed using disks with a conductive material mounted on a top surface, and a conductive material mounted on a second surface. Each disk and its conductive surfaces are separated from adjacent disks and their conductive surfaces by a dielectric material. The laminated structure forms a cylindrical backplane where circuit cards are radially mounted to the backplane by inserting the cards into slots in the perimeter of the cylindrical structure. The slots contain contacts where similarly positioned contacts of a particular disk are electrically connected to form a bus structure. As a result, similarly positioned conductive surfaces on circuit cards are electrically connected when the cards are inserted into the slots.

7 Claims, 4 Drawing Sheets

LAMINATED CYLINDRICAL BACKPLANE

CROSS REFERENCE TO RELATED INVENTION

This application is related to commonly assigned and currently filed US Patent Application entitled "Backplane Arrangement For Electrical Equipment", Ser. No. 08/361,928 still pending.

BACKGROUND OF THE INVENTION

1. Field of the Invention

The present invention relates to an electronic equipment arrangement; more specifically, a cylindrical backplane for electronic circuit cards.

2. Description of the Related Art

FIG. 1 illustrates a prior art backplane arrangement. Backplane 10 comprises upper connectors 12 and lower connectors 14. Contacts 16 within each connector pair, 12 and 14, mate with contacts on the surface of a circuit card. The contacts on the surface of the circuit card are positioned near the edge of the card so that they make contact with electrical contacts 16 when the card edge is inserted into the connector. Backplane 10 typically includes conductors that connect corresponding contacts on each of the connectors to create a bus structure. For example, contacts 18, 20, 22 and similarly positioned contacts of connectors 12, are connected through the conductors of backplane 10. This arrangement provides a convenient busing connection between circuit cards that are designed to meet a particular input/output standard. For example, if contacts 18, 20, 22 and the corresponding contacts of connectors 12, are designated as a power contact, all circuit cards designed to mount to backplane 10 have a power contact that mates with the power contacts of connector 12 when the card is inserted into the connector.

Unfortunately, with today's high-speed circuitry, the horizontal length of backplane 10 has a finite limit, for example, ISA (Industry Standard Architecture) backplanes are limited to approximately 22 inches. If the horizontal dimension of the backplane is made larger, propagation delays and transmission line effects interfere with signal transmissions between cards that are at the far ends of the backplane. As a result, the number of circuit cards that can be mounted to backplane 10 is limited to the of circuit cards that can be mounted within a length of approximately 22 inches. Unfortunately, the circuit cards cannot be mounted too close to each other because of cooling requirements. If the cards are mounted too closely together, cooling air does not circulate sufficiently and results in circuit card overheating. Typically, 0.8 inches is provided between the circuit cards in a ISA backplane. As a result, only 25 circuit cards are mounted in a backplane such as backplane 10. This limits the amount of high-speed circuitry that can be positioned within a single backplane, and thereby limits the amount of functionality that can be provided.

SUMMARY OF THE INVENTION

The present invention addresses the aforementioned problems by providing an arrangement that reduces the maximum distance a signal must travel between circuit cards. Additionally, the invention provides an arrangement that permits the circuit cards to be mounted closer together without adversely effecting cooling. As a result, more circuit cards can be mounted on a single backplane while providing adequate cooling and better signal transmission characteristics.

The present invention provides a generally cylindrical backplane with the cards radially mounted along the circumference of the backplane. This arrangement decreases the maximum distance traveled by a signal to approximately the diameter of the cylinder formed by the backplane. Additionally, the radial mounting of the circuit cards permits closer card spacing while maintaining efficient cooling.

The cylindrical backplane is made of a laminated structure. The laminated structure includes disks with a conductive surface mounted on a top surface and another conductive surface mounted on a lower surface. Each disk and its conductive surfaces are separated from adjacent disks and their conductive surfaces by a dielectric material. The laminated structure forms a cylindrical backplane where cards are radially mounted to the backplane by inserting the circuit cards into slots in the cylindrical structure. The slots of the cylindrical structure contain electrical contacts, where similarly positioned contacts of a particular disk are electrically connected to form a bus structure. The contacts within the slots form an electrical connection with conductive surfaces near an edge of a circuit card when the circuit card edge is inserted into one of the slots in the cylindrical backplane. As a result, corresponding conductive surfaces on each of the circuit cards are electrically connected by a bus structure, where the distance between points on the bus is approximately the diameter of the cylindrical backplane.

DETAILED DESCRIPTION OF THE INVENTION

Figure 1:
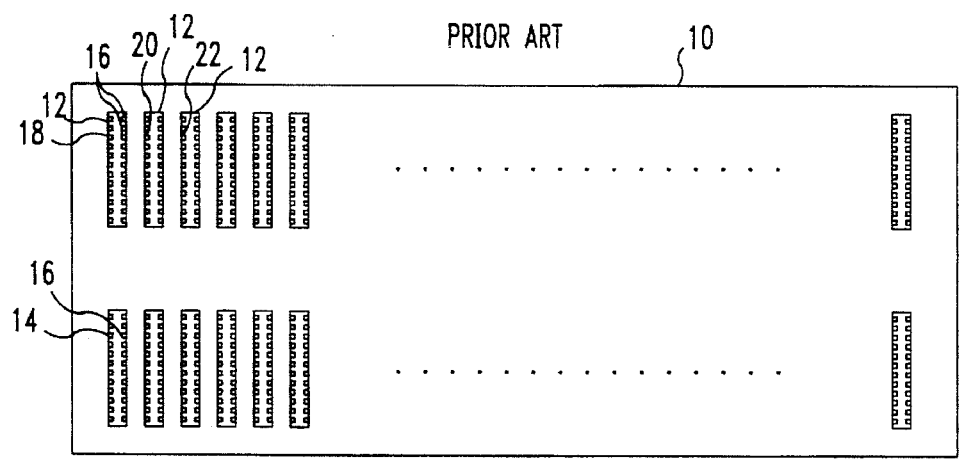
FIG. 1 illustrates a prior art backplane.
Figure 2:
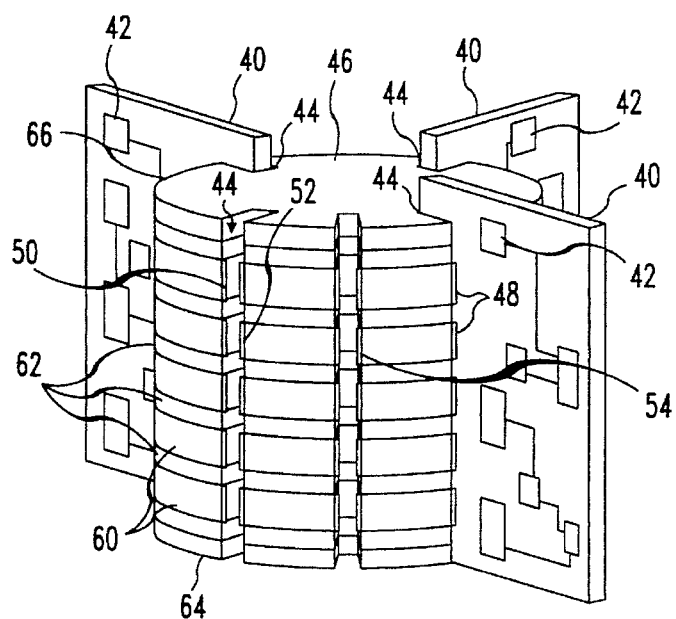
FIG. 2 illustrates a cylindrical backplane with cards extending radially from the backplane.

FIG. 2 illustrates the laminated cylindrical backplane with circuit cards inserted. Circuit cards 40 with electrical components 42 are inserted into slots 44 of cylindrical backplane 46. Conductive surfaces 48 positioned on the surface and near the edge of circuit card 40, make electrical contact with contacts 50 within slot 44 when the edge of the circuit card where it is inserted into slot 44.

Corresponding contacts 50 in each slot 44 are connected to form buses. For example, contact 52 and contact 54 are electrically connected by the bus structure of cylindrical backplane 46. That is, similarly positioned or corresponding contacts of a particular layer are connected to form buses.

The laminated structure of cylindrical backplane 46 is formed with disk sections 60 separated by dielectric layers 62. Dielectric layer 62 prevents conductive surfaces on the top of one disk layer 60 from short circuiting to conductive surfaces on the lower surface of an adjacent disk 60. Dielectric material 62 may be fabricated using rubber or a non-conductive plastic. Bottom layer 64 and top layer 66 provide protection and structural strength, and may be made of a material such as fiberglass.

Figure 3:
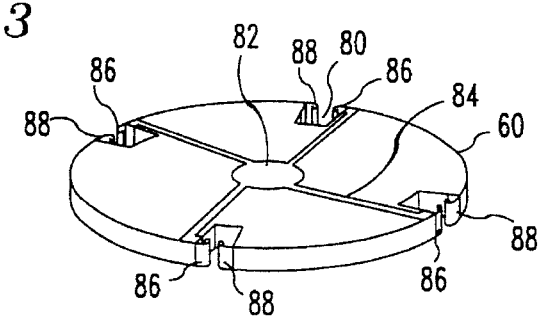
FIG. 3 illustrates a disk and its conductive surfaces.

FIG. 3 illustrates disk 60 that is used to form the laminated structure of cylindrical backplane 46. Each disk 60 contains slots adapted to receive an edge of a circuit card. Slots 80 are arranged along the circumference of disk 60 and may be arranged relatively closely together depending on the number of circuit cards required. For the sake of clarity, FIG. 3 shows only 4 slots. Conductive material 82 is on the top surface of disk 60. Conductive material 82 includes arms 84 that extend out to each of slots 80. Each arm 84 terminates in a contact 86. On the lower surface of disk 60 (not shown in FIG. 3) is a similar conductive material with arms that terminate in contacts 88. From the figure it can be seen that when circuit cards are inserted into slots 80, conductive surfaces on one side of the circuit card make electrical contact with contacts 86, and that conductive surfaces on the opposite side of the circuit card make electrical contact with contacts 88. As a result, all circuit card conductive surfaces that make electrical contact with contact 86 are on a bus, where the length of that bus is equal to approximately two times the radius of disk 60. Similarly, all circuit card conductive surfaces that are in electrical contact with contact 88, are bused together by the conductive surface on the lower surface of disk 60.

Figure 4:
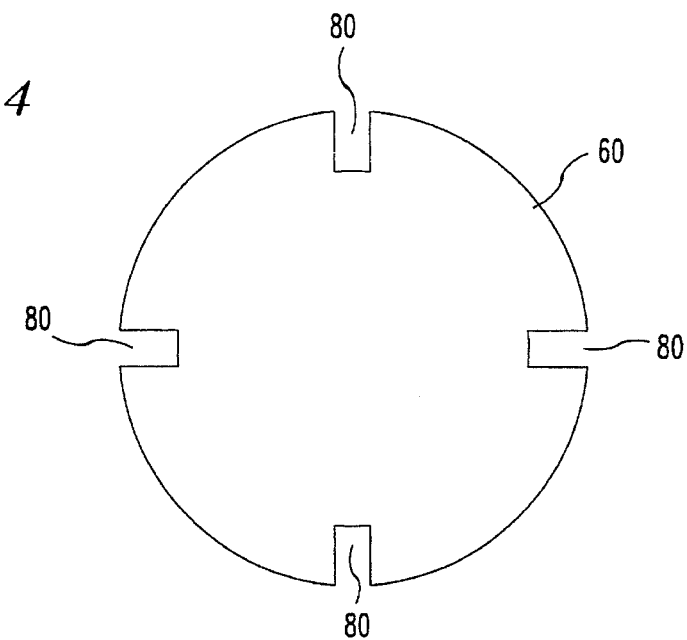
FIG. 4 illustrates the top view of a disk without its conductive surfaces.

FIG. 4 illustrates a top view of disk 60. Slots 80 are arranged along the circumference or perimeter of disk 60, and are adapted to receive the edge of a circuit card. Any number of slots may be used as long as there is sufficient space so that adjacent circuit cards do not mechanically interfere. Disk 60 may be made of a material such as fiberglass.

Figure 5:
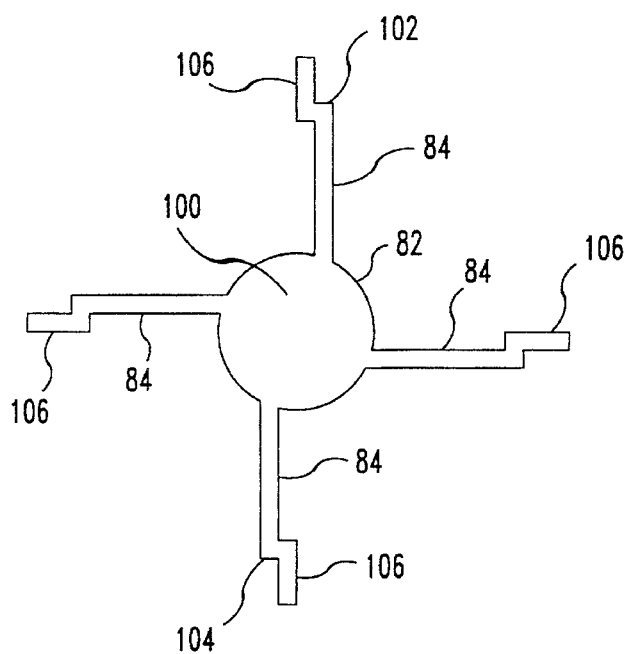
FIG. 5 illustrates the shape of the conductive material that is used to form the conductive surface on the upper portion of the disk.

FIG. 5 illustrates conductive material 82 that is used on the top surface of disk 60. Conductive material 82 may be a material such as copper that is stamped out of a thin sheet of copper. Conductive material 82 includes central section 100 and arms 84. The distance from position 102 to position 104 on opposite arms should be approximately equal to the diameter of disk 60. End portions 106 of arms 84 are used to make contacts 86 that were shown in FIG. 3.

Figure 6:
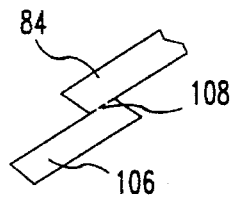
FIGS. 6, 7 and 8 illustrate how a contact is formed using one of the legs of the conductive material of FIG. 5.
Figure 7:
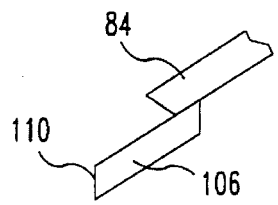
Figure 8:
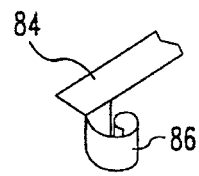

FIGS. 6, 7 and 8 illustrate how end section 106 of arm 84 is used to form contact 86. FIG. 6 illustrates the end portion of arm 84 including end section 106. The first step in forming contact 86 is to bend end section 106 downward along line 108. This results in the shape illustrated in FIG. 7 with end section 106 at a right angle to the remaining portion of arm 84. Contact 86 is then formed by grasping end 110 of end section 106 and rolling end 110 in a counter clockwise direction to form contact 86 which is illustrated in FIG. 8.

Figure 9:
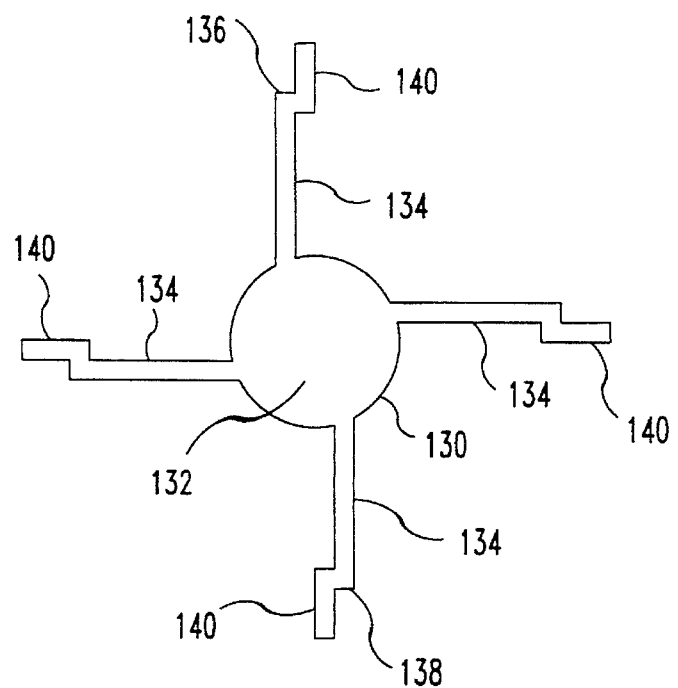
FIG. 9 illustrates the shape of the conductive material that is used to form a conductive surface on the lower portion of the disk.

FIG. 9 illustrates conductive material 130 which is used on the lower surface of disk 60. As with conductive material 82, conductive material 130 is stamped from a thin conductive material such as copper. Material 130 includes center section 132 with arms 134. The distance between position 136 and 138 of opposites are should be approximately equal to the diameter of disk 60. End sections 140 of arms 134 are used to form contacts 88.

Figure 10:
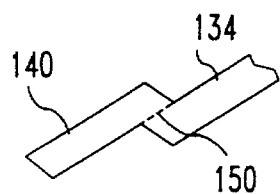
FIGS. 10, 11 and 12 illustrate forming a contact using one of the legs of the conductive material of FIG. 9.
Figure 11:
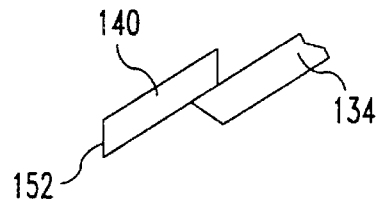
Figure 12:
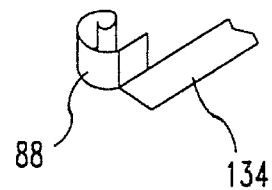

FIGS. 10, 11 and 12 illustrates how end section 140 is used to form contact 88. FIG. 10 illustrates a portion of arm 134 and end section 140. The first step in forming contact 88 involves bending end section 140 in an upward direction along line 150. This results in the shape illustrated in FIG. 11 with end section 140 at a right angle to the remaining portion of arm 134. Contact 88 is then formed by grasping end 152 of end section 140 and rotating in a clockwise direction to form contact 88 which is illustrated in FIG. 12.

Figure 13:
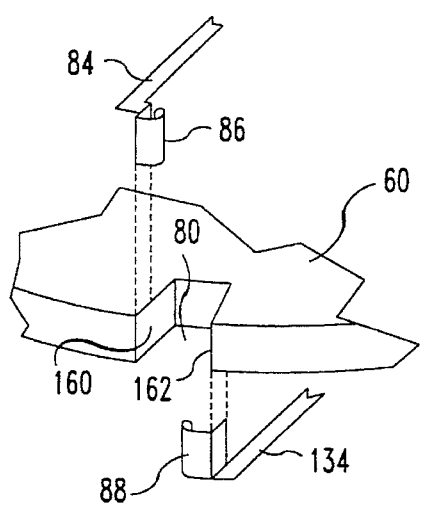
FIG. 13 illustrates how the contact portions of the conductive surfaces of FIGS. 8 and 12 are assembled to the disk.

FIG. 13 illustrates how contacts 86 and 88, formed at the ends of arms 84 and 134 respectively, align with slot 80 of disk 60. When conductive material 82 is placed on the top surface of disk 60 and arm 84 is positioned to lie just adjacent to slot 80, contact 86 is positioned within slot 80 adjacent to surface 160. Similarly, when conductive material 130 is positioned on the lower surface of disk 60 and arm 134 is positioned just adjacent to slot 80, contact 88 is positioned within slot 80 adjacent to surface 162.

Figure 14:
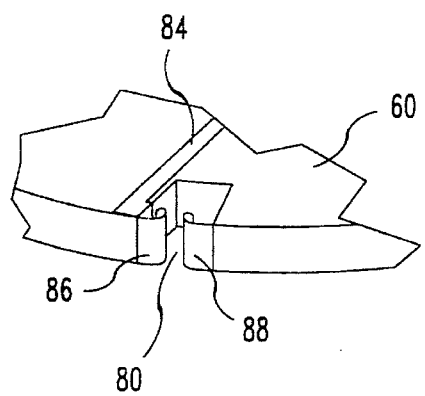
FIG. 14 illustrates the contact surfaces in a slot of the disk of FIG. 3.

FIG. 14 illustrates slot 80 after conductive surfaces 82 and 130 have been applied to the upper and lower surfaces of disk 60, respectively. As a result, it can be seen that contact 86 and contact 88 are now positioned in slot 80 where they can make electrical contact with a conductive surface near the edge of a circuit card when the edge of the circuit card is inserted into slot 80.

Other embodiments of the conducting surfaces may be employed. For example, the dielectric and conductors may be formed from printed wiring board material such as FR4 glass epoxy with laminated and/or etched copper/tin paths. In this embodiment, external contacts capable of connecting the circular disks to the plugable adapter card are used to provide the media for continuity. The external contacts are connected to the internal layers using plated through hole technology while leaving the exposed epoxy surface to form the dielectric layer between adjacent disks. A mixture of internal layer and external conductive surfaces may also be used to facilitate yet another embodiment. The embodiment of choice depends on the bus selection and the desired physical and electrical attributes.

Figure 15:
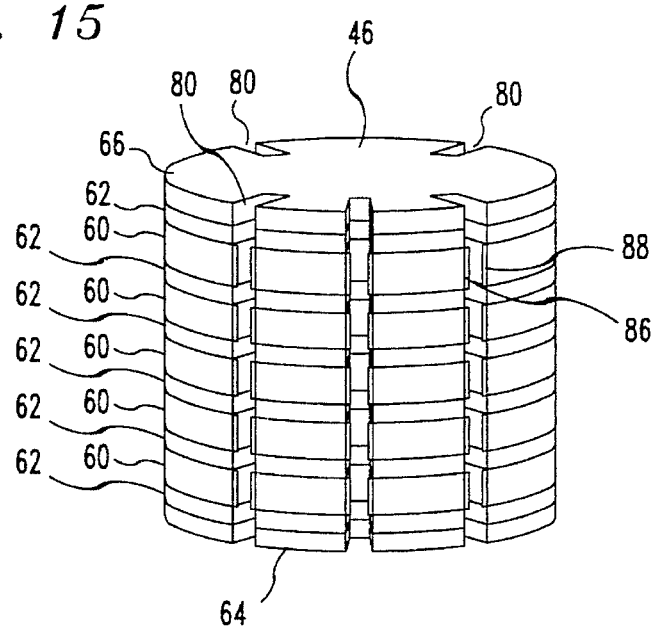
FIG. 15 illustrates the laminated cylindrical backplane without circuit cards inserted.

FIG. 15 illustrates laminated cylindrical backplane 46 without circuit cards inserted into slots 80. The figure illustrates a laminated structure where disks 60 are separated from each other by dialectic material 62. In slots 80, contacts 86 and 88 are visible. Contacts 86 of each disk are connected into a bus structure through conductive surface 82 on top of each disk 60, and contacts 88 of each disk are connected into a bus structure through conductive surface 130 on the lower surface of each disk 60. Returning to FIG. 2, mounting circuit cards 40 to cylindrical backplane 46 in an radial form provides efficient cooling when a fan is introduced below the cylindrical arrangement. Cooling air is blown up through the circuit cards so that the warm air can rise out and away from the components on the cards. Since the cards are arranged in a radial fanlike orientation, adjacent slots 80 can be positioned closely together without overly restricting the flow of cooling air. As a result of positioning slots 80 closely together, a large number of circuit cards can be mounted on a single backplane. In addition, its possible to provide electromagnetic shielding for this type of arrangement by using a cylindrical metal fixture that slides over the entire arrangement which includes the circuit cards mounted radially to the cylindrical backplane.

The sets of contacts within the slots of the backplane may also be implemented using one of the widely available edge connectors used in devices such as personal computers. In this implementation, the connectors are inserted in the slots and the leads on the rear of the connector are electrically connected to the appropriate conductive surfaces on disks 60. It is also possible to fabricate backplane 46 without slots by securing edge connectors to the perimeter of the backplane with the leads on the rear of the connector electrically connected to the appropriate conductive surfaces on disks 60.

It is also possible to implement backplane 46 in non-cylindrical shapes. Other shapes, such as polygons, may be used where the perimeter of the backplane receives circuit cards using an arrangement such as slots with contacts, slots with connectors or connectors secured to the perimeter of the backplane.

I claim:

1. A laminated backplane, comprising:

a plurality of support layers arranged in a layered structure, said support layers having a plurality of slots positioned along a perimeter, said slots being adapted to receive an edge of a circuit card;

a plurality of contacts positioned along said perimeter of at least one of said support layers, at least one of said plurality of contacts being positioned in one of said slots; and means for electrically connecting corresponding contacts, said corresponding contacts belonging to said plurality of contacts.

2. The backplane of claim 1, wherein said plurality of contacts comprises a first set of corresponding contacts and a second set of corresponding contacts.

3. The backplane of claim 2, wherein said means for electrically connecting corresponding contacts comprises a first conductive material in electrical contact with said first set of corresponding contacts, said first conductive material being positioned on a first surface perpendicular to said perimeter of said support layer, and a second conductive material in electrical contact with said second set of corresponding contacts, said second conductive material being positioned on a second surface perpendicular to said perimeter of said support layer.

4. The backplane of claim 3, wherein said first set of corresponding contacts are formed using end sections of said first conductive material and said second set of corresponding contacts are formed using end sections of said second conductive material.

5. The backplane of claim 1, wherein said means for electrically connecting corresponding contacts comprises a conductive material positioned on a surface perpendicular to said perimeter of said support layer.

6. The backplane of claim 5, wherein said corresponding contacts are formed using end sections of said conductive material.

7. A laminated backplane, comprising:

a plurality of support layers arranged in a layered structure;

a first plurality of contacts positioned along a perimeter of a support layer belonging to said plurality of support layers;

a second plurality of contacts positioned along said perimeter of said support layer;

a plurality of slots positioned along said perimeter of said support layer, said slots being adapted to receive an edge of a circuit card, one of said first plurality of contacts being positioned in each of said slots and one of said second plurality of contacts being positioned in each of said slots;

first means for electrically connecting said first plurality of contacts, said first means for electrically connecting being positioned on a first surface of said support layer perpendicular to said perimeter; and second means for electrically connecting said second plurality of contacts, said second means for electrically connecting being positioned on a second surface of said support layer perpendicular to said perimeter.

\* \* \* \* \*